(12) United States Patent
Uhlendorf

(10) Patent No.: US 7,211,504 B2
(45) Date of Patent: May 1, 2007

(54) PROCESS AND ARRANGEMENT FOR THE SELECTIVE METALLIZATION OF 3D STRUCTURES

(75) Inventor: Ingo Uhlendorf, Dresden (DE)

(73) Assignee: Infineon Technologies AG, Munich (DE)

( * ) Notice: Subject to any disclaimer, the term of this patent is extended or adjusted under 35 U.S.C. 154(b) by 243 days.

(21) Appl. No.: 10/652,520

(22) Filed: Aug. 29, 2003

(65) Prior Publication Data

US 2004/0087127 A1 May 6, 2004

(30) Foreign Application Priority Data

Sep. 2, 2002 (DE) ................. 102 40 921

(51) Int. Cl.
*H01L 21/44* (2006.01)
(52) U.S. Cl. ........................ 438/614; 438/623; 438/652
(58) Field of Classification Search ................ 438/614, 438/620, 622, 623, 625, 652, 665, 674
See application file for complete search history.

(56) References Cited

U.S. PATENT DOCUMENTS

| | | | | |
|---|---|---|---|---|
| 4,385,102 A | * | 5/1983 | Fitzky et al. ................ | 429/111 |
| 4,975,175 A | * | 12/1990 | Karube et al. ......... | 204/403.12 |
| 5,091,062 A | * | 2/1992 | Revell .................... | 205/138 |
| 5,126,035 A |  | 6/1992 | Kiesel et al. ................ | 204/415 |
| 5,314,765 A | * | 5/1994 | Bates .................... | 429/231.95 |
| 5,690,807 A | * | 11/1997 | Clark et al. ................ | 205/655 |
| 5,859,397 A | * | 1/1999 | Ichinose et al. ....... | 204/157.15 |
| 5,869,206 A | * | 2/1999 | Sotomura .................. | 429/123 |
| 5,937,320 A |  | 8/1999 | Andricacos et al. | |
| 6,720,107 B1 | * | 4/2004 | Holtom et al. ............... | 429/105 |
| 6,764,586 B1 | * | 7/2004 | Fleury ......................... | 205/159 |
| 2001/0013651 A1 |  | 8/2001 | Nakazawa .................. | 257/737 |
| 2002/0074238 A1 | * | 6/2002 | Mayer et al. ............... | 205/660 |

FOREIGN PATENT DOCUMENTS

| | | |
|---|---|---|
| DE | 3841621 | 6/1992 |
| DE | 69599388 | 10/1997 |
| EP | 0675674 | 7/1997 |
| EP | 0295914 | 12/1998 |
| EP | 1229154 | 8/2002 |
| JP | 63305532 | 12/1998 |
| JP | 1102650 | 1/1999 |
| JP | 0110832 | 4/2001 |
| KR | 0082735 | 11/1999 |
| KR | 0090469 | 10/2001 |

* cited by examiner

*Primary Examiner*—Phuc T. Dang
(74) *Attorney, Agent, or Firm*—Baker Botts L.L.P.

(57) ABSTRACT

A process is provided for the selective metallization of 3D structures, particularly for the selective gold-plating of 3D contact structures on wafers, such as contact bumps, which are electrically connected to a bond pad on the wafer via a three-dimensional, mechanically flexible structure in the form of a redistribution layer, for subsequent electrical connection to a carrier element, e.g., a printed circuit board. The process is intended to considerably simplify the process sequence. The metallization of the previously prepared 3D structures on the wafer is carried out electrochemically, under current or potential control, by the structures being partially immersed in an electrolyte with a fixed surface. The electrolyte can be covered with a membrane which is permeable to the corresponding ions, or alternatively a gel electrolyte may be used.

10 Claims, 2 Drawing Sheets

PROCESS AND ARRANGEMENT FOR THE SELECTIVE METALLIZATION OF 3D STRUCTURES

BACKGROUND OF THE INVENTION

The invention relates to a process for the selective metallization of 3D structures, in particular for the selected gold-plating of 3D contact structures on wafers, such as contact bumps, which are electrically connected to a bond pad on the wafer via a three-dimensional, mechanically flexible structure in the form of a redistribution layer, for subsequent electrical connection to a carrier element, e.g., a printed circuit board.

The increasing integration of semiconductor components and the constantly rising number of electrical connections which are required between semiconductor chips and carrier elements, and in particular the need to miniaturize the electronic modules which are to be produced has led to the use of direct contact-making with the semiconductor chips on the carrier element (flip-chip bonding). This has considerably simplified assembly technology, since metallic intermediate carriers and the production of wire bridging links for making electrical contact can be dispensed with.

However, in order to allow direct contact to be made with semiconductor chips on carrier elements, such as a PCB (printed circuit board), it is necessary to produce 3D structures, known as solder bumps, on the semiconductor chip, these structures at their highest point in each case having a gold-plated contact surface, which is connected via a metal conductor track to a bonding pad of the semiconductor chip.

These solder bumps may be three-dimensional, mechanically flexible structures, resulting in a certain degree of compensation for mechanical loads on the finished assembly, for example caused by different coefficients of thermal expansion of the individual components or during their handling.

The metal conductor tracks comprise, for example, a Cu conductor track and a layer of Ni above it, which is used to protect the layer of Cu from corrosion. Beneath the metal conductor tracks (redistribution layer) and the solder bumps there is a dielectric, so that it is ensured that there is only an electrical connection between the gold-plated contact surface on the solder bump and the associated bond pad. To achieve solderability, the nickel layer has to be coated with gold at the corresponding locations, i.e., the tips of the 3D structures.

In this context, it must at all costs be ensured that the gold coating takes place only at the tips of the 3D structures or that the redistribution layer which leads down from the 3D structures is absolutely free of gold, in order to ensure a solder stop during soldering of the semiconductor chip on a carrier element. Otherwise, the solder material would flow uncontrolled over the redistribution layer and adversely affect mechanical and electrical properties. In particular, the reliability of the finished electronic module would be adversely affected.

In the methods which are currently in practical use, the need to pattern the layer of gold is realized by a generally known lithographic process. This is effected by the gold being deposited on the entire redistribution layer immediately after the Cu/Ni of the distribution layer has been deposited. Then, the gold layer is covered by a lithography mask, so that selective etching can take place and ultimately a layer of gold remains only directly at the tip of the 3D structure.

According to the prior art, the production of the layer of gold and its patterning, in simplified form, involves the following process steps:

Cu/Ni plating by layer electrodeposition
Au plating of the entire redistribution layer by layer electrodeposition
electrophoretic coating of the structure with photoresist
exposure of the solder stop mask
developing of the solder stop mask
gold strip, i.e., removal of the uncovered gold layer using a cyanide-based solution
Continuation with common process flow This process sequence requires considerable outlay and also involves the possibility of defects on account of the large number of process steps.

The invention is based on the object of providing a process for the selective metallization of 3D structures, in particular for the selective gold-plating of 3D contact structures on semiconductor chips, using a simplified process sequence. Furthermore, it is an object to provide an arrangement for carrying out the method which is simple to realize.

SUMMARY OF INVENTION

The objective on which the invention is based is achieved through the fact that the metallization of the previously prepared 3D contact structures on the semiconductor chips is carried out electrochemically or under potential control, by the structures being partially immersed in an electrolyte with a fixed surface.

This process significantly simplifies the process sequence for the so-called elastic package in wafer level packaging, by virtue of the fact that one lithographic level is eliminated and the etching of excess gold which is otherwise required is avoided. A further advantage of this process is that it can be used in very general terms to metallize 3D structures on wafers. The novel process therefore comprises only the steps of producing the Cu/Ni redistribution layer followed by the local metallization of the tips of the 3D structures, e.g., by gold-plating.

It is expedient for the 3D structure to be immersed only until the surface to be metallized is in each case completely wetted.

In a refinement of the invention, the electrolyte with a fixed surface is designed as a gel electrolyte or is covered with a membrane which is permeable to the corresponding ions.

The gel electrolyte can be produced without problems on the basis of inorganic materials, e.g., silica gel.

Of course, gel electrolyte can also be produced on the basis of organic materials. It can, for example, be based on polyacrylic acid, polyvinylphosphoric acid, polyethyleneamine, polyvinylamine, PEO (polyelctrolyte), polyvinylidene fluoride hexafluoropropylene, polyamidoacrylic acid or carboxymethylcellulose,or mixtures of these materials.

Furthermore, the object on which the invention is based is achieved, by virtue of the fact that a vertically adjustable holder for holding and making contact with a wafer is arranged above the vessel, the wafer being held upside down in the holder and at the same time being electrically contacted so as to form a cathode.

A device of this type is simple to realize and allows uncomplicated and rapid mounting of the wafer in the holder.

In a refinement of the invention, the holder supports the wafer in such a manner that it can be held horizontally with its active side facing downwards. In this position, the wafer can be moved onto the electrolyte. The clamping structure can advantageously also serve as electrical connection structure. In addition, the connection structure is advantageously insulated from touching the electrolyte.

It is preferable for the clamping structure to have bearing elements designed as a channel, or similar to a channel, with a bearing edge, so that it is easy for the wafer to be pushed laterally into the holder.

Furthermore, in the edge region of the wafer the bearing element can have a protected area inside the channel, which cannot come into contact with the electrolyte, electrical contact being made with the wafer in the protected area.

A further configuration of the invention is characterized in that the immersion movement of the vertically adjustable holder with the wafer suspended from it into the electrolyte located in the vessel is monitored by a displacement-measuring apparatus, in order to ensure that only the tips of the 3D structures which are to be metallized are immersed in the electrolyte.

Alternatively, the immersion movement of the vertically adjustable holder with the wafer suspended in it into the electrolyte located in the vessel can be continued at least until electrical contact has been made with the electrolyte.

Finally, it is also possible to perform a further advancing movement after initial electrical contact, so that a defined region of the tip of the 3D structure is immersed in the electrolyte.

The invention is to be explained in more detail below on the basis of an exemplary embodiment.

DESCRIPTION OF THE INVENTION

Figure 1:
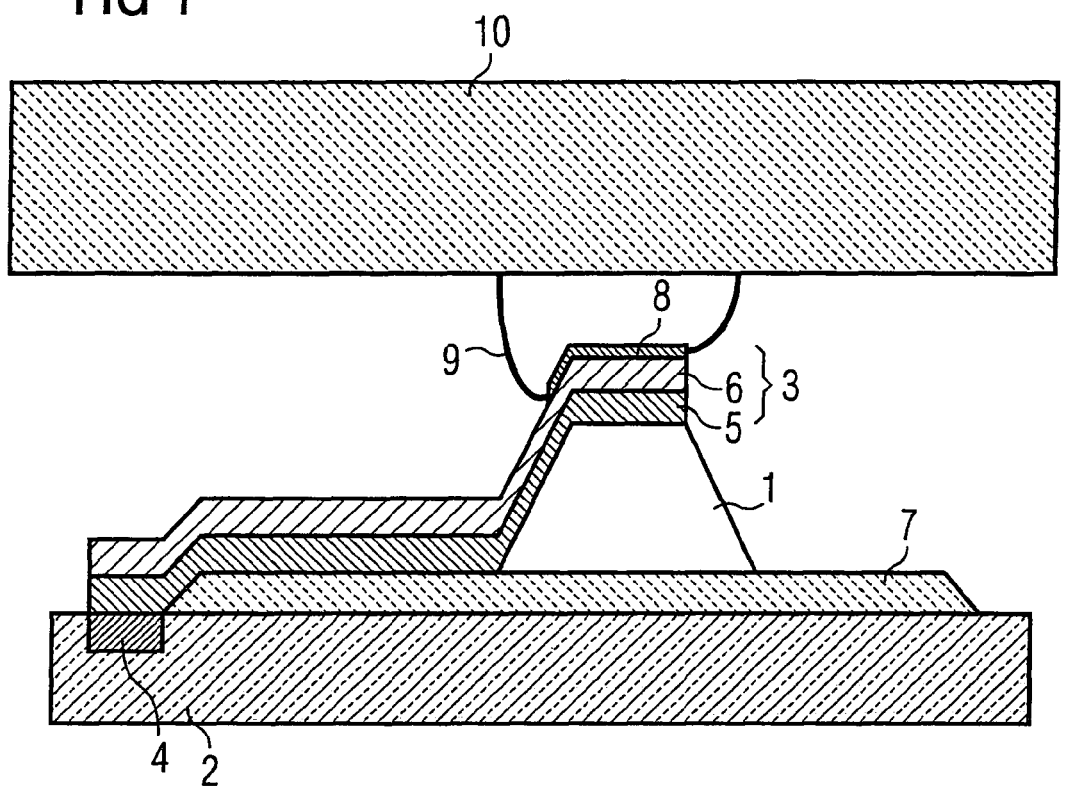
FIG. 1 diagrammatically depicts a 3D structure, in which a three-dimensional flexible structure leads from the bond pad on a wafer to a point at which a soldered joint to a PCB is produced.
Figure 2:
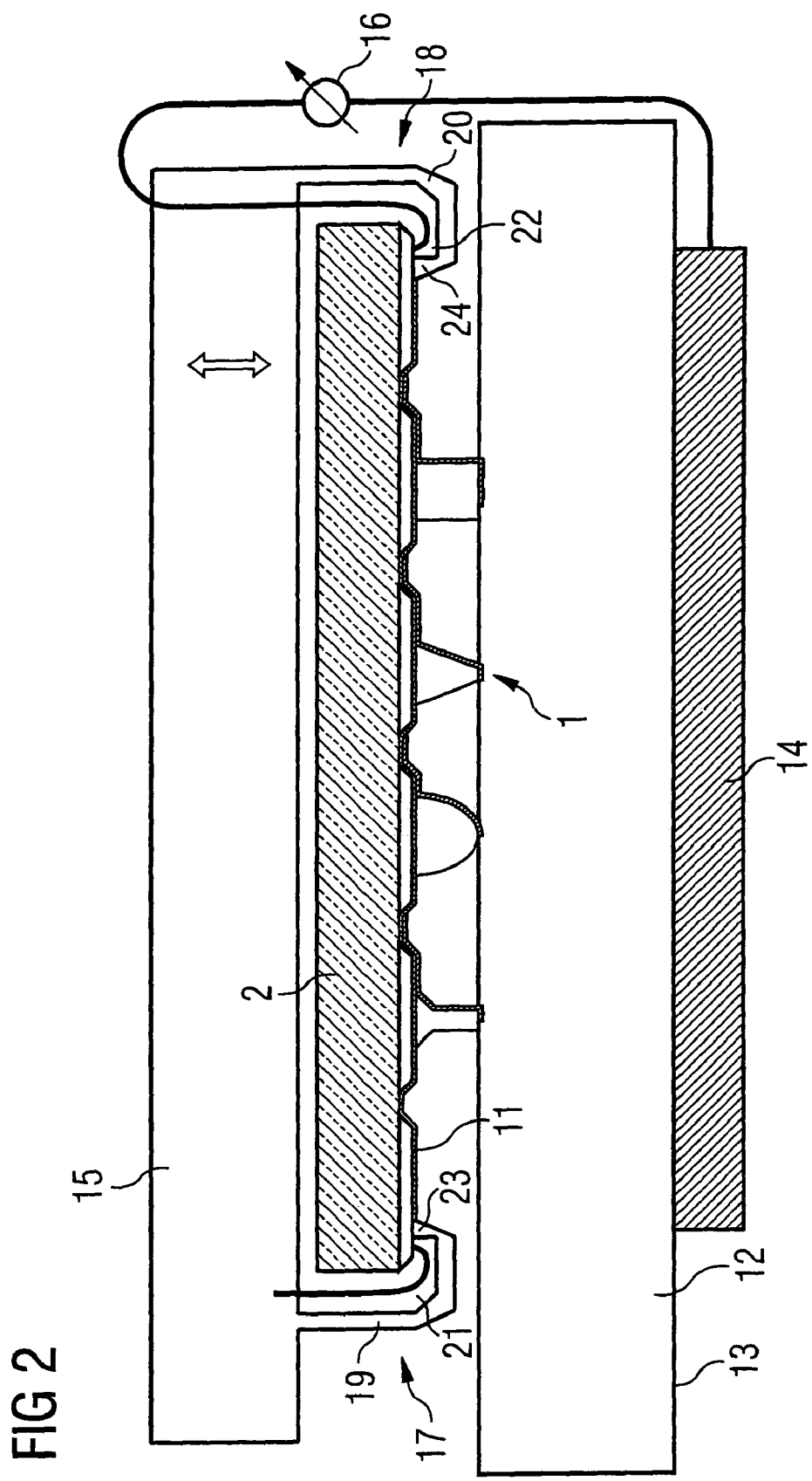
FIG. 2 diagrammatically depicts an arrangement for metallizing 3D structures in accordance with FIG. 1.

FIG. 1 illustrates an outline view of a 3D structure 1 on a wafer 2, which is electrically connected to a bond pad 4 via a redistribution layer 3. This redistribution layer 3 consists of a Cu layer 5 and an Ni layer 6 above it for protecting the Cu layer 5 and leads over a dielectric 7 to the highest point of the 3D structure 1. At the tip of the 3D structure 1, the redistribution layer 3 is provided with an Au layer 8, so that electrical and mechanical connection to a printed circuit board PCB 10 can be produced by means of a solder material 9. To ensure sufficient bonding strength and the electrochemical deposition of the redistribution layer 3 on the wafer and the dielectric 7, a seed layer 11 is deposited prior to the redistribution layer 3 (FIG. 2).

The tip of the 3D structure 1 is coated with an Au layer 8 using the greatly simplified process of the invention.

According to this process, the metallization (gold-plating) of the previously prepared 3D structures 1 on the wafer 2 takes place by the wafer being partially immersed in an electrolyte 12 in a vessel 13, followed by electrochemical layer build-up under current or potential control. The 3D structure 1 is immersed only until the surface to be metallized is completely wetted. Of course, the same process can also be used to produce other metal layers instead of an Au layer.

The electrolyte 12 has a fixed surface, which is achieved, for example using a gel electrolyte, or alternatively covering the electrolyte with a membrane which is permeable to the corresponding ions.

The gel electrolyte can be produced without problems using known inorganic materials, such as silica gel. It may be formed using organic materials, such as polyvinylphosphoric acid, polyvinyl amine, PED polyvinylidene fluoride polyarnidoacrylic acid or mixtures of these materials. The gel electrolyte can also be based on organic materials, such as polyacrylic polyethyleneamine, (polyelectrolyte), hexafluoropropylene, carboxymethylcellulose The use of an electrolyte with a fixed surface, according to this invention, maintains the horizontal orientation of the surface, but prevents uncontrolled wetting or the formation of waves through vibrations caused by the immersion operation and by capillary forces.

The arrangement with which the novel process can be carried out comprises a vessel 13 for holding the electrolyte 12, and an anode 14 located at the vessel 13 and a vertically adjustable holder 15 arranged above the vessel 13. The holder 15 is used to hold and make electrical contact with the wafer 2, which is held upside down in the holder 15. Electrical contact is made with the appropriate conductors on wafer 2, so as to form a cathode.

The anode 14 and the cathode are electrically connected to one another via a current source 16, which optionally includes a current monitoring arrangement, it being possible to adjust the current which flows between anode 14 and the cathode through the electrolyte 12 using the current source 16.

The holder 15 is a preferred arrangement including two receiving devices 17, 18 which are arranged at a distance from one another and each having at least one bearing element 19, 20 for receiving the wafer 2. The bearing elements 19, 20, as seen in cross-section, are shaped as an inwardly directed hooks. The bearing elements 19, 20 form channels 21, 22, each having a bearing edge 23, 24. As a result, the bearing element 19, 20 has a protected area inside the channel 20, 21 in the edge region of the wafer 2, so that electrical contact can be made with the wafer 2 in the protected area.

Of course, the receiving devices 17, 18 can also be constructed from individual hook-shaped elements; it is only important for it to be possible for the wafer 2 to be reliably held upside down in a defined position.

To gold-plate the tips of the 3D structures 1, the vertically adjustable holder 15 with the wafer 2 suspended in it executes a defined immersion movement into the electrolyte 12 located in the vessel 13. In addition or as an alternative, the immersion movement of the vertically adjustable holder 15 with the wafer 2 suspended in it into the electrolyte 12 located in the vessel 13 can also be limited by recording first electrical contact between one of the 3D structures 1 and the electrolyte 12 using a current monitoring arrangement at current source 16. It is then possible to carry out a further slight advancing movement.

In principle, it is also possible, by way of example, to provide three additional 3D structures 1, with which electrical contact can be made and detected separately, to control the precise horizontal orientation of the wafer 2. This would make it possible to detect an incorrect immersion operation on account of the fact that fewer than three 3D structures are immersed, and can be effected by suitable current or voltage monitoring.

The above-described process and the device can be used without problems to produce any desired metal layers on 3D structures.

While there have been described what are believed to be the preferred embodiments of the invention, those skilled in the art will recognize that other and further changes and modifications may be made thereto without departing from the spirit of the invention, and it is intended to claim all such changes and modifications as fall within the true scope of the invention.

I claim:

1. A process for metallization of 3D structures of raised portions of circuits on a wafer that are raised relative to the wafer surface in a direction normal to the wafer surface for subsequent electrical connection to a carrier element, the process comprising the steps of:
   providing an electrolyte with a fixed surface, contacting only said 3D raised circuit portions that are raised relative to the wafer surface in a direction normal to the wafer surface with said fixed surface of said electrolyte, and
   applying current between said 3D raised circuit portions that are raised relative to the wafer surface in a direction normal to the wafer surface and said electrolyte to electrochemically metallize said 3D raised circuit portions selectively.

2. The process according to claim 1, characterized in that the step of contacting said raised 3D circuit portions comprises immersing said raised 3D circuit portions to a depth which is sufficient for a surface portion of the 3D structure which is to be metallized to be completely wetted.

3. The process according to claim 1 wherein the electrolyte is a gel electrolyte.

4. The process according to claim 3 wherein the gel electrolyte comprises inorganic materials.

5. The process according to claim 4 wherein the gel electrolyte comprises a silica gel.

6. The process according to claim 3 wherein the gel electrolyte comprises organic materials.

7. The process according to claim 6 wherein the gel electrolyte comprises at least one organic material selected from the group of polyacrylic acid, polyvinylphosphoric acid, polyethyleneamine, polyvinylamine, PRO (polyelectrolyte), polyvinylidene fluoride hexafluoropropylene, polyamidoacrylic acid and carboxymethyl cellulose and any combination thereof.

8. The process according to claim 1 wherein the electrolyte is covered with a membrane which is permeable to the ions of the electrolyte.

9. A process for metallization of 3D structures of raised portions of circuits on a wafer that are raised relative to the wafer surface in a direction normal to the wafer surface for subsequent electrical connection to a carrier element, the process comprising the steps of:
   providing an electrolyte with a fixed surface, contacting only said 3D raised circuit portions that are raised relative to the wafer surface in a direction normal to the wafer surface with said fixed surface of said electrolyte, and
   applying current between said 3D raised circuit portions that are raised relative to the wafer surface in a direction normal to the wafer surface and said electrolyte to electrochemically metallize said 3D raised circuit portions selectively.

10. The process according to claim 1, characterized in that the step of contacting said raised 3D circuit portions that are raised relative to the wafer surface in a direction normal to the wafer surface comprises immersing said raised 3D circuit portions that are raised relative to the wafer surface in a direction normal to the wafer surface to a depth which is sufficient for a surface portion of the 3D structure which is to be metallized to be completely wetted.

* * * * *